United States Patent
Wada et al.

(10) Patent No.: US 11,881,380 B2
(45) Date of Patent: Jan. 23, 2024

(54) PLASMA PROCESSING APPARATUS

(71) Applicant: Panasonic Intellectual Property Management Co., Ltd., Osaka (JP)

(72) Inventors: Toshihiro Wada, Osaka (JP); Naoaki Takeda, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 99 days.

(21) Appl. No.: 17/503,611

(22) Filed: Oct. 18, 2021

(65) Prior Publication Data
US 2022/0122809 A1 Apr. 21, 2022

(30) Foreign Application Priority Data
Oct. 20, 2020 (JP) ................................. 2020-176349

(51) Int. Cl.
*H01J 37/32* (2006.01)

(52) U.S. Cl.
CPC ... *H01J 37/32119* (2013.01); *H01J 37/32183* (2013.01); *H01J 37/32541* (2013.01); *H01J 37/32651* (2013.01)

(58) Field of Classification Search
CPC ........... H01J 37/32119; H01J 37/32183; H01J 37/32541; H01J 37/32651
See application file for complete search history.

(56) References Cited

U.S. PATENT DOCUMENTS

| | | | |
|---|---|---|---|
| 2002/0023899 A1* | 2/2002 | Khater | H01J 37/321 |
| | | | 219/121.41 |
| 2004/0163594 A1* | 8/2004 | Windhorn | H01J 37/32082 |
| | | | 118/723 E |

FOREIGN PATENT DOCUMENTS

| | | | | |
|---|---|---|---|---|
| CN | 110223904 A | * | 9/2019 | ........ H01J 37/32091 |
| JP | 2009-076797 A | | 4/2009 | |
| JP | 2010272709 | * | 6/2010 | |
| JP | 4831853 B2 | * | 12/2011 | ............. B23K 10/00 |
| KR | 101869950 B1 | * | 7/2018 | |

* cited by examiner

*Primary Examiner* — Henry Luong
(74) *Attorney, Agent, or Firm* — PEARNE & GORDON LLP

(57) ABSTRACT

A plasma processing apparatus 100 including: a chamber 101 having a dielectric window; a coil 102 placed outside the chamber so as to face the dielectric window; a FS electrode 103 having a plate shape and placed on the chamber side of the coil; a first power source 104 for supplying a high-frequency power of a first frequency to the coil 102; a second power source 105 for supplying a high-frequency power of a second frequency which is different from the first frequency, to the FS electrode 103; a first matcher 106 placed between the first power source and the coil; a second matcher 107 placed between the second power source and the FS electrode; and a first frequency attenuation filter connected between the second matcher and the FS electrode, and configured to allow transmission of the high-frequency power of the second frequency and inhibit transmission of the high-frequency power of the first frequency.

10 Claims, 3 Drawing Sheets

PLASMA PROCESSING APPARATUS

CROSS REFERENCE TO RELATED APPLICATION

The present application is based on and claims priority under 35 U.S.C. § 119 with respect to the Japanese Patent Application No. 2020-176349 filed on Oct. 20, 2020, of which entire content is incorporated herein by reference into the present application.

TECHNICAL FIELD

The present invention relates to a plasma processing apparatus.

BACKGROUND

An inductively-coupled plasma processing apparatus including a chamber, an induction coil (ICP electrode) that supplies a high-frequency power for generating a plasma in the chamber, and a Faraday shield electrode (hereinafter sometimes referred to as an "FS electrode") provided between the chamber and the induction coil is known (see, e.g., Japanese Laid-Open Patent Publication No. 2009-76797).

To the induction coil (ICP electrode), a first high-frequency power is applied via a first power source. Likewise, to the FS electrode, a second high-frequency power is applied via a second power source. The first high-frequency power and the second high-frequency power are usually substantially the same frequency. The first high-frequency power and the second high-frequency power are individually controlled according to the state of a plasma to be generated in the chamber.

Between the induction coil and the first power source, a first matcher is provided for impedance matching between the induction coil and the first power source. Likewise, between the FS electrode and the second power source, a second matcher is provided for impedance matching between the FS electrode and the second power source.

An electrical coupling (e.g., inductive coupling) is present between the induction coil and the FS electrode. Therefore, in some cases, the first high-frequency power supplied to the induction coil is transmitted through the electrical coupling between the induction coil and the FS electrode and enters the second matcher side via the FS electrode.

The second matcher is provided to optimize the second high-frequency power applied to the FS electrode. However, when the first high-frequency power enters into the second matcher, the second matcher attempts to optimize the total of the second high-frequency power supplied from the second power source and the electric power transmitted through the electrical coupling between the induction coil and the FS electrode. As a result, in some cases, the second matcher that performs impedance matching between the FS electrode and the second power source fails to exert its function.

In order to prevent the above-mentioned entry of the first high-frequency power into the second matcher side, one solution has been to control the phase of the first high-frequency generated by the first power source and the phase of the second high-frequency generated by the second power source, so that the frequency interference is unlikely to occur between the first high-frequency supplied to the induction coil and the second high-frequency supplied to the FS electrode. In this solution, the phases of the first and second high-frequencies can be preferably controlled so as to be reversed after passing through the first and second matchers, respectively. In other words, it is necessary to individually control the phase of the first high-frequency generated by the first power source and the phase of the second high-frequency generated by the second power source, depending on the setting of the first matcher and the setting of the second matcher, respectively.

As described above, in the conventional plasma processing apparatus, the settings of the first and second matchers should be changed every time so that the phase of the high frequency and the impedance can be set as desired, according to the state of a plasma to be generated, which has required complicated control.

Furthermore, the electrical coupling between the induction coil and the FS electrode also depends on the setting of a load capacitor which is connected in parallel with the second power source in the second matcher. Therefore, in controlling the second matcher, it is desirable to fix the setting of the load capacitor. In this case, however, it is difficult to control both the phase of the high frequency and the impedance, which has been problematic when controlling the high-frequency power to be applied to the FS electrode.

SUMMARY

One aspect of the present invention relates to a plasma processing apparatus, including: a chamber having a dielectric window; a coil placed outside the chamber so as to face the dielectric window; a Faraday shield electrode having a plate shape and placed on the chamber side of the coil; a first power source for supplying a high-frequency power of a first frequency to the coil; a second power source for supplying a high-frequency power of a second frequency to the Faraday shield electrode, the second frequency being different from the first frequency; a first matcher placed between the first power source and the coil; a second matcher placed between the second power source and the Faraday shield electrode; and a first frequency attenuation filter connected between the second matcher and the Faraday shield electrode, and configured to allow transmission of the high-frequency power of the second frequency and inhibit transmission of the high-frequency power of the first frequency.

According to the present invention, a plasma to be generated in the chamber can be easily controlled, and stable plasma generation can be achieved.

DETAILED DESCRIPTION

Figure 1:
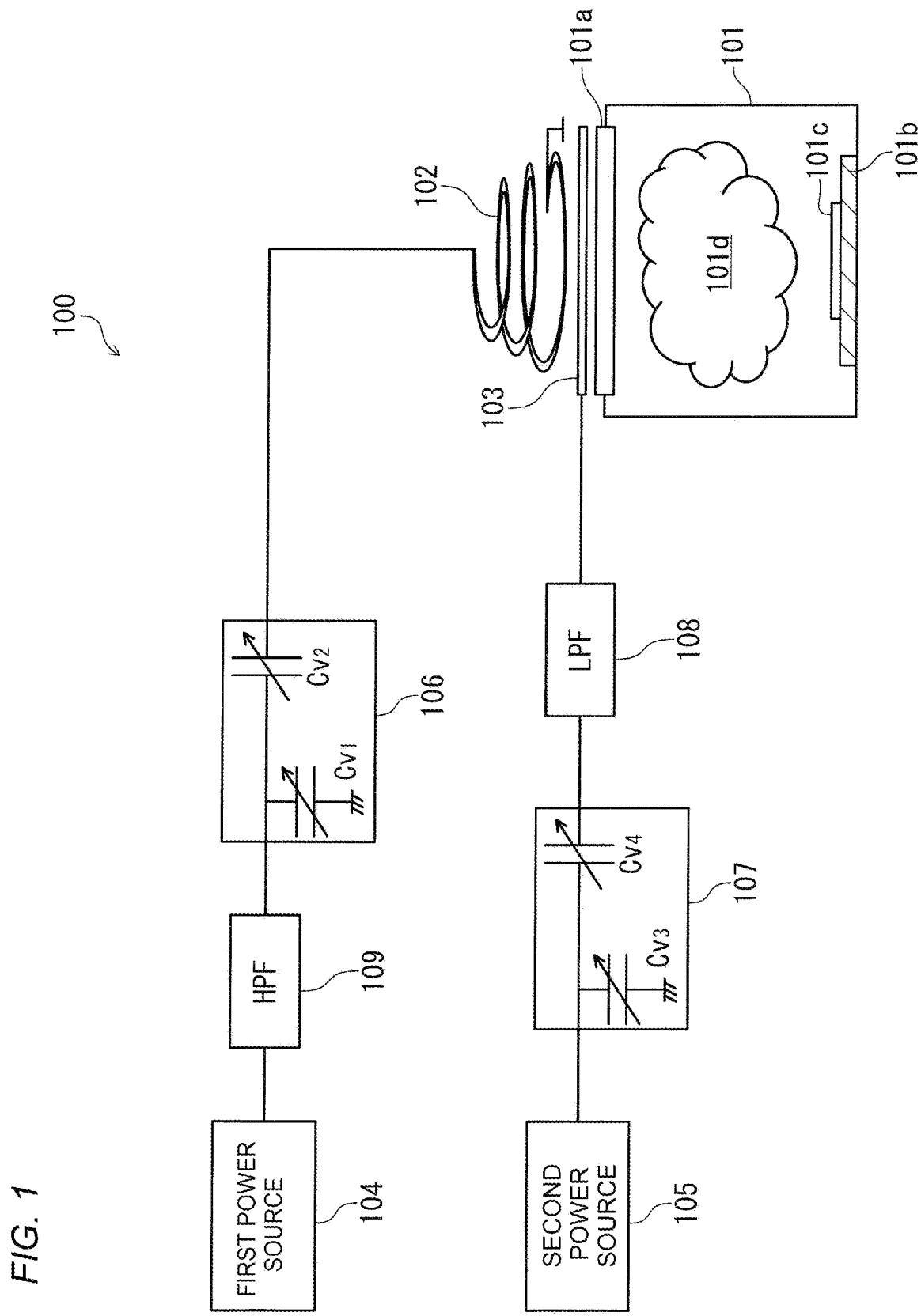
FIG. 1 is a block diagram schematically showing a configuration of a plasma processing apparatus according to an embodiment of the present invention.

A plasma processing apparatus according to the present invention includes a chamber having a dielectric window, a coil placed outside the chamber so as to face the dielectric window, a Faraday shield electrode having a plate shape and placed on the chamber side of the coil (hereinafter referred to as an "FS electrode", as appropriate), a first power source for supplying a high-frequency power of a first frequency $f_1$ to the coil, a second power source for supplying a high-frequency power of a second frequency $f_2$ which is different from the first frequency, to the FS electrode.

According to the above plasma processing apparatus, electric powers with different frequencies are applied to the coil (ICP electrode) and the FS electrode, and thus, frequency interference is unlikely to occur. This reduces or eliminate the necessity of controlling the phase of the high-frequency power between the coil and the FS electrode, which can ease the plasma generation control in the chamber.

Between the first power source and the coil, a first matcher is provided. Between the second power source and the FS electrode, a second matcher is provided. The first matcher matches the impedance between the coil and the first power source so that the high-frequency power from the first power source can be efficiently transmitted to the coil. The second matcher matches the impedance between the FS electrode and the second power source so that the high-frequency power from the second power source can be efficiently transmitted to the FS electrode.

The plasma processing apparatus further includes a first frequency attenuation filter connected between the second matcher and the FS electrode. While allowing the transmission of the high-frequency power of the second frequency, the first frequency attenuation filter inhibits the transmission of the high-frequency power of the first frequency. Thus, the signal of high frequency having entered the FS electrode side from the first power source through the electrical coupling between the coil and the FS electrode is cut off by the first frequency attenuation filter, and can be prevented from being transmitted via the second matcher. Therefore, the high-frequency power of the first frequency supplied to the coil is unlikely to enter into the second matcher, leading to a reduced power loss. The setting of the second matcher can be controlled independently from that of the first matcher, regardless of the phase difference between the first and second high-frequency powers, and of the magnitude of the electrical coupling between the coil and the FS electrode.

Furthermore, the FS electrode has a plate shape. This can reduce the inductance of the FS electrode, and thus can reduce the electrical coupling (inductive coupling) between the coil and the FS electrode. The first matcher may be directly connected to the coil (e.g., without via a circuit, such as a filter). This can make it easy to configure the circuit configuration on the ICP side compactly in size. Here, the first matcher is directly connected to the coil means that no passive element, such as a resistor, a coil, and a capacitor, and no active element, such as a transistor, are present between the first matcher and the coil.

The plasma processing apparatus may further include a second frequency attenuation filter placed between the coil and the first power source, and configured to allow the transmission of the high-frequency power of the first frequency and inhibit the transmission of the high-frequency power of the second frequency. This can also suppress the high-frequency power from the second power from entering into the first power source through the electrical coupling between the coil and the FS electrode. As a result, the magnitude of the high-frequency power supplied from the first power source can be accurately measured using a power monitor connected to the first power source, and the plasma to be generated can be accurately controlled.

In terms of enhancing the measurement accuracy of the high-frequency power supplied from the first power source, the second frequency attenuation filter is placed between the coil and the first power source, which may be on the first power source side with respect to the first matcher, or may be on the coil side with respect to the first matcher. However, a higher voltage may be applied between the first matcher and the coil than between the first matcher and the first power source. Therefore, the second frequency attenuation filter is preferably placed between the first matcher and the first power source. In this case, size reduction is possible.

The first frequency $f_1$ of the high-frequency power supplied from the first power source to the coil may be higher or lower than the second frequency $f_2$ of the high-frequency power supplied from the second power source to the FS electrode. When the first frequency $f_1$ is higher than the second frequency $f_2$, for example, the first frequency attenuation filter may be a low pass filter (LPF), and the second frequency attenuation filter may be a high pass filter (HPF). When the first frequency $f_1$ is lower than the second frequency $f_2$, for example, the first frequency attenuation filter may be a high pass filter (HPF) and the second frequency attenuation filter may be a low pass filter (LPF). The high pass filter (HPF) hardly attenuates the components of input signals of frequencies higher than a cutoff frequency, and attenuates those of frequencies lower than the cutoff frequency. The low pass filter (LPF) hardly attenuates the components of input signals of frequencies lower than a cutoff frequency, and attenuates those of frequencies higher than the cutoff frequency. As the high pass filter and the low pass filter, a known circuit configuration can be employed.

The cutoff frequency of the high-pass filter and the low pass filter is represented by a frequency at which the pass gain of the input signal is at approximately 3 dB below the passband value. In the present embodiment, the high pass filter and the low pass filter are each configured such that its cutoff frequency is at between the first frequency $f_1$ and the second frequency $f_2$. When the difference between the first frequency $f_1$ and the second frequency $f_2$: $|f_1-f_2|$ is 1 MHz or more, it is easy to configure the first frequency attenuation filter and the second frequency attenuation filter each having desired cutoff characteristics. The $|f_1-f_2|$ is, for example, 4 MHz or less.

The first frequency $f_1$ and the second frequency $f_2$ are not limited to a specific value, as long as they are different frequencies. However, the second frequency $f_2$ of the high-frequency power supplied to the FS electrode may be 10 MHz or more. When the second frequency $f_2$ is 10 MHz or more, the voltage applied to the FS electrode can be prevented from increasing too high, and the dielectric breakdown between the FS electrode and the coil or between the FS electrode and the ground can be suppressed.

The first frequency $f_1$ is, for example, 10 MHz to 30 MHz. The second frequency $f_2$ is, when it is lower than the first frequency $f_1$, for example, 1 MHz to 30 MHz.

In the plasma processing apparatus of the present embodiment, since the first frequency $f_1$ is different from the second frequency $f_2$, no frequency interference occurs in principle between the high-frequency power supplied to coil and that supplied to the FS electrode. However, when one of the first and second frequencies $f_1$ and $f_2$ is an integer multiple of the other, frequency interference may occur. Therefore, the first frequency $f_1$ and the second frequency $f_2$ are preferably set to satisfy a condition in which one of the first and second frequencies $f_1$ and $f_2$ is not an integer multiple of the other, so that the occurrence of frequency interference can be suppressed. For example, the higher one of the first and second frequencies $f_1$ and $f_2$ may be set less than twice the other being a lower frequency, so as to satisfy the above condition.

Here, the ratio $f_1/f_2$ of the first frequency $f_1$ to the second frequency $f_2$ is expressed by an irreducible fraction: $f_1/f_2=n/m$, where n and m are relatively prime to each other. The phase of the high-frequency power of the first frequency $f_1$ from the first power source and that of the second frequency $f_2$ from the second power source, as a whole, vary in a cycle T expressed by $T=n/f_1=m/f_2$. Therefore, the longer the cycle T expressed by the above equation is, the more effectively the occurrence of frequency interference can be suppressed. For suppressing the occurrence of frequency interference, more preferably, the smaller one of n and m is greater than ½ of the larger one, and is 5 or more.

A description will be given below of a plasma processing apparatus according to an embodiment of the present invention, with reference to the drawings. FIG. 1 is a block diagram schematically showing a configuration of a plasma processing apparatus according to an embodiment of the present invention.

A plasma processing apparatus 100 includes a chamber 101, a coil 102, an FS electrode 103, a first power source 104 for supplying a high-frequency power to the coil 102, a second power source 105 for supplying a high-frequency power to the FS electrode 103, a first matcher 106 placed between the first power source 104 and the coil 102, a second matcher 107 placed between the second power source 105 and the FS electrode 103, and a low pass filter 108 connected between the second matcher 107 and the FS electrode 103. The plasma processing apparatus 100 may further include a high pass filter 109 between the coil 102 and the first power source 104 (e.g., between the first matcher 106 and the first power source 104).

The chamber 101 can be configured with, for example, a box-shaped housing container having an opening at its top surface, and a lid covering the opening of the housing container. With an object to be processed being housed in the container, the opening of the container is closed with the lid, and thus, the container is sealed. After the pressure inside the sealed chamber is reduced, a process gas is suppled thereinto, and a high-frequency power is applied to the coil 102. The chamber 101 is equipped with a vacuum suction means that reduces the pressure inside the chamber, and a gas supply means that introduces a process gas serving as a plasma raw material into the chamber. The vacuum suction means can be configured of an exhaust port communicating with the chamber, a vacuum pump, an exhaust piping, a pressure regulator valve, or the like. The gas supply means can be configured of a gas cylinder for supplying a process gas, such as argon, oxygen, or nitrogen, a piping for introducing a process gas into the chamber, or the like.

The chamber 101 has a dielectric window 101a which is provided in its side wall (e.g., at the lid or a side wall of the housing container). Part or all of the lid may also serve as a dielectric window. The coil 102 is placed outside the chamber 101 so as to face the dielectric window 101a. On the chamber 101 side of the coil 102 (here, between the coil 102 and the chamber 101), the FS electrode 103 is placed. The FS electrode 103 has a flat plate shape and is disposed so as to cover the dielectric window 101a. To allow electromagnetic fields generated by the coil 102 to act on the plasma in the chamber through the dielectric window 101a, the FS electrode 103 is provided with a slit (through-hole), so that the surface of the dielectric window 101a is not entirely covered with the FS electrode 103. The coil 102 covers the dielectric window 101a, with the FS electrode 103 interposed therebetween. The FS electrode 103 may be placed inside the chamber 101 (inside from the inner wall of the chamber 101).

In the chamber 101, an object to be processed 101c is seated on a stage 101b, and is subjected to a plasma processing. The stage 101b may be provided with a lower electrode for applying a bias voltage.

Figure 2:
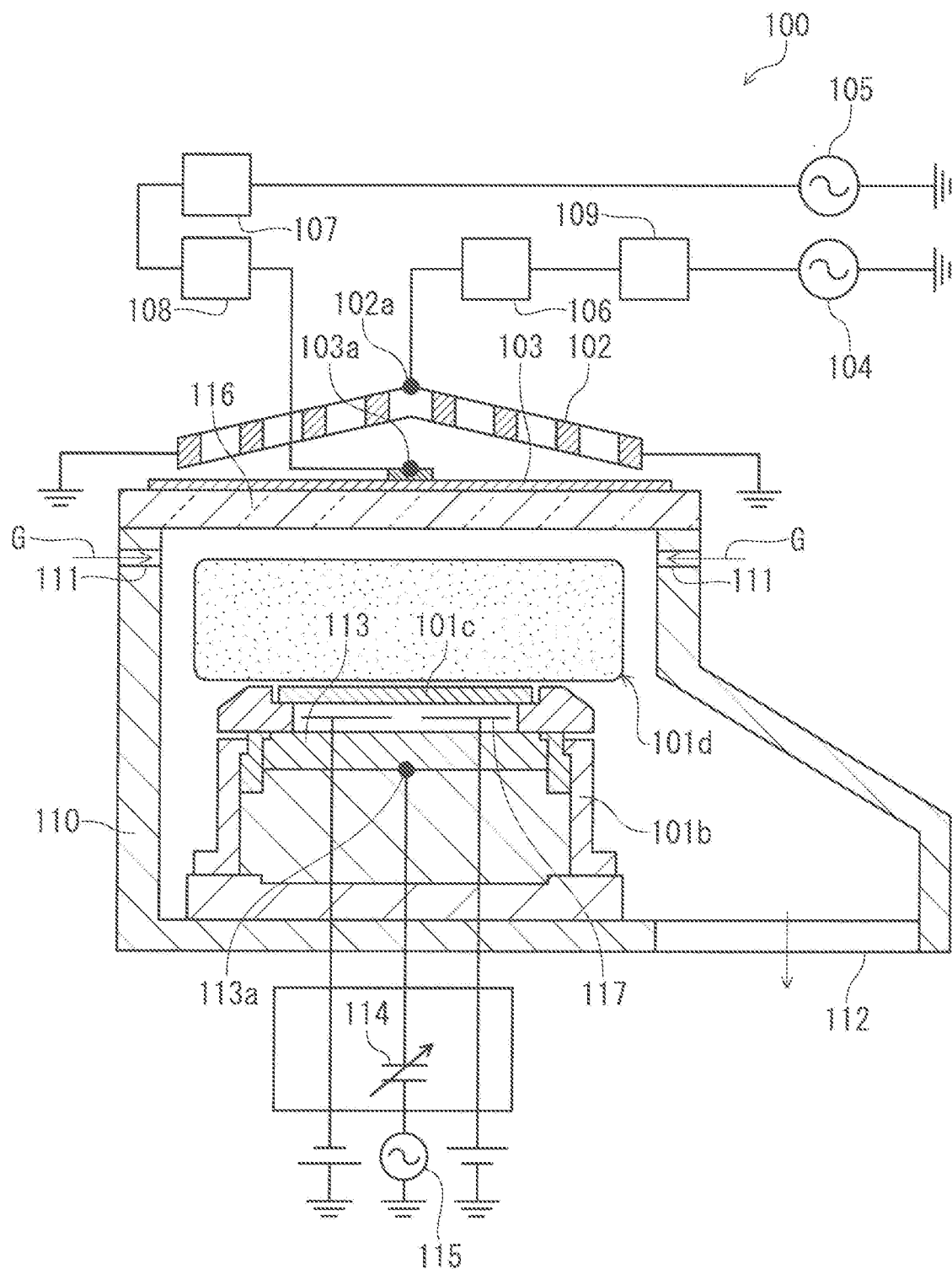
FIG. 2 is a cross-sectional structure diagram schematically showing an example of a chamber configuration of the plasma processing apparatus.

FIG. 2 is a cross-sectional structural view specifically showing the configuration of the chamber 101. In the illustrated example in FIG. 2, the chamber 101 has an opening at its top surface, and includes a housing container 110 for housing an object to be processed, and a dielectric member (dielectric window) 116 serving as a lid covering the opening of the housing container 110. The FS electrode 103 is disposed on the side opposite to the housing container 110 of the dielectric member (dielectric window) 116.

The FS electrode 103 may be provided on the lid or may be embedded in the inner wall of the lid. In this case, the lid can serve to protect the FS electrode 103 from plasma. In this case, at least part of the lid on the housing container 110 side may be made of, for example, quartz or aluminum nitride (AlN).

The housing container 110 is approximately cylindrical in shape having an opening at is top, and the top opening is sealed with a dielectric member 116 serving as a lid. Likewise, the dielectric member 116 is approximately circular plate-like in shape conforming to the opening shape of the housing container 110. The chamber 101 is provided with a gas supply port 111 for supplying a process gas G, and an exhaust port 112 for reducing the pressure in the chamber 101 to a predetermined level. The gas in the chamber 101 is exhausted through the exhaust port 112, so that the chamber is maintained in a reduced pressure atmosphere. The housing container 110 is provided with a gate (not shown) through which the object to be processed is loaded and unloaded.

A coil 102 is placed on the side opposite to the dielectric member 116 of the FS electrode 103. The coil 102 can be formed of a conductor extending spirally from the center toward the outer peripheral side, when viewed from a direction perpendicular to the outer surface of the lid (dielectric member 116). The conductor may be, for example, a ribbon-shaped metal plate or metal wire. The number of conductors constituting the coil 102 is not limited, and the shape of the coil 102 is also not limited. The coil 102 may be, for example, a single spiral-type coil constituted of one conductor, or may be a multiple spiral-type coil formed of induction coils constituted of a plurality of conductors which are connected in parallel. The coil 102 may be a planar coil formed by stretching a conductor spirally in the same plane, or a three-dimensional coil formed by stretching a conductor spirally with a variation added in a direction perpendicular to the outer surface of the lid (dielectric member 116).

In FIG. 2, the coil 102 is a three-dimensional coil made of one or more belt-shaped conductors (coil members) formed into a conical shape, for example, a circular-conical shape, in its overall appearance. Each of the coil members (e.g., four coil members) can be arranged so as to pivot in the same direction about a single center position 102a which is an apex. The coil 102 is electrically connected at the center position 102a to the first power source 104, so that a high-frequency power of the first frequency $f_1$ is applied via the high pass filter 109 and the first matcher 106. Here, the outer peripheral end of the spiral shape of a coil member in the coil 102 is grounded.

The FS electrode 103 is a thin disc-like electrode made of a conductive material formed in a shape having a contour slightly smaller than the contour of the lid (dielectric member 116). The FS electrode 103 is disposed on the top surface of the lid (dielectric member 116), with its center position 103a aligned vertically with the center position 102a of the ICP coil 102. At the center position 103a of the FS electrode 103, the FS electrode 103 is electrically connected to the second power source 105, so that the second high-frequency power of the second frequency $f_2$ is applied via the second matcher 107 and the low pass filter 108.

The stage 101b has a lower electrode 113 incorporated therein. The lower electrode 113 has, for example, a disc shape, and is electrically connected, at its center position 113a, to a lower electrode high-frequency power source 115 via a variable capacitor 114, so that a predetermined high-frequency power is applied. The stage 101b can be equipped with an electrostatic chuck (ESC) 117 for electrostatically adsorbing and holding the object to be processed 101c seated thereon. Furthermore, the stage 101b can be provided with a coolant circulation channel for controlling the temperature of the object to be processed 101c.

By applying a high-frequency power to the FS electrode 103, a bias voltage is generated between the dielectric member 116 and the plasma, allowing the ions in the plasma to act on the object to be processed, as well as on the dielectric member 116. This can suppress the adhesion of a nonvolatile substance onto the dielectric member 116. The FS electrode 103 can be formed in a pattern, for example, having radial slits so that the high-frequency power outputted from the coil 102 can be transmitted therethrough. The FS electrode 103 can be provided with, for example, a plurality of slits formed radially so as to extend from its outer peripheral end of the disc shape toward its center position. Each of the slits can be formed, for example, in the same shape and size, and can be arranged point symmetrically with respect to the center position 103a. The FS electrode is, for example, a plate of metal, such as copper or aluminum.

The material constituting the housing container 110 is exemplified by a metal material having sufficient rigidity, such as aluminum and stainless steel (SUS), an aluminum with anodic oxide coating, and the like. The material constituting the dielectric member 116 is exemplified by a dielectric material, such as yttrium oxide ($Y_2O_3$), aluminum nitride (AlN), alumina ($Al_2O_3$), and quartz ($SiO_2$).

Referring back to FIG. 1, the first power source 104 is electrically connected to the coil 102 and supplies a high-frequency power of the first frequency $f_1$ to the coil 102. This generates a plasma 101d inside the chamber 101, and the object to be processed 101c is plasma processed. In the illustrated example in FIG. 1, the first frequency $f_1$=13.56 MHz.

The second power source 105 is electrically connected to the FS electrode 103 and supplies a high-frequency power of the second frequency $f_2$ to the FS electrode 103. The second frequency $f_2$ is different from the first frequency $f_1$, and $f_2$=12.5 MHz in the illustrated example in FIG. 1. When a high-frequency power is applied, the FS electrode 103 is capacitively coupled to the dielectric window 101a, to generate a bias voltage between the dielectric window 101a and its vicinity (i.e., the inner wall of the chamber in the vicinity of the dielectric window 101a), and the plasma. Thus, the ions in the plasma act on the object to be processed, as well as on the dielectric window and the inner wall of the chamber in the vicinity of the dielectric window. This consequently can suppress the adhesion of a nonvolatile reaction product generated by the plasma processing of the object, onto the inner wall of the chamber.

The first matcher 106 is placed between the first power source 104 and the coil 102. The first matcher 106 includes, for example, a first variable capacitor $C_{V1}$ for loading connected in parallel with the first power source 104, and a second variable capacitor $C_{V2}$ for impedance adjustment connected in series between the first power source 104 and the coil 102. With the first variable capacitor $C_{V1}$ and the second variable capacitor $C_{V2}$, the phase of the high frequency of the first frequency $f_1$ (the phase of the voltage) and the impedance of the first matcher can be adjusted.

The phase of the high frequency of the first frequency $f_1$ and the impedance of the first matcher are determined depending on both the first variable capacitor $C_{V1}$ and the second variable capacitor $C_{V2}$. Usually, the phase of the high frequency of the first frequency $f_1$ is controlled to a desired value by, with the capacitance of the first variable capacitor $C_{V1}$ for loading fixed, varying the capacitance of the second variable capacitor $C_{V2}$. In controlling to a desired high frequency phase, however, the amount of capacitance to be varied of the second variable capacitor $C_{V2}$ depends not only on the phase of the high frequency to be controlled, but also on the capacitance of the first variable capacitor $C_{V1}$.

The second matcher 107 is placed between the second power source 105 and the FS electrode 103. The second matcher 107 includes, for example, a third variable capacitor $C_{V3}$ for loading connected in parallel with the second power source 105, and a fourth variable capacitor $C_{V4}$ for impedance adjustment connected in series between the second power source 105 and the FS electrode 103. With the third variable capacitor $C_{V3}$ and the fourth variable capacitor $C_{V4}$, the phase of the high frequency of the second frequency $f_2$ (the phase of the voltage) and the impedance of the second matcher can be adjusted.

The phase of the high frequency of the second frequency $f_2$ and the impedance of the second matcher are determined depending on both the third variable capacitor $C_{V3}$ and the fourth variable capacitor $C_{V4}$. Usually, the phase of the high frequency of the second frequency $f_2$ is controlled to a desired value by, with the capacitance of the third variable capacitor $C_{V3}$ for loading fixed, varying the capacitance of the fourth variable capacitor $C_{V4}$. In controlling to a desired high frequency phase, however, the amount capacitance to be varied of the fourth variable capacitor $C_{V4}$ depends not only on the phase of the high frequency to be controlled, but also on the capacitance of the third variable capacitor $C_{V3}$.

In the plasma processing apparatus 100, the first power source 104 and the second power source 105 supply high-frequency powers of different frequencies ($f_1 \neq f_2$). It is therefore not necessary to control the phase of the high frequency of the first frequency $f_1$ supplied from the first power source 104 nor the phase of the high frequency of the second frequency $f_2$ supplied from the second power source 105. It is only necessary to control the impedance of the first matcher and the impedance of the second matcher. Therefore, the first and third variable capacitors $C_{V1}$ and $C_{V3}$ for loading may be replaced with an ordinary capacitor having a fixed capacitance. With the second variable capacitor $C_{V2}$, the impedance of the first matcher can be controlled, and with the fourth variable capacitor $C_{V4}$, the impedance of the second matcher can be controlled. In this way, the circuit configuration of the first matcher and/or the second matcher can be simplified, and the first matcher and/or second matcher which are compact in size and inexpensive can be realized.

The low pass filter 108 allows the high frequency of the second frequency $f_2$ supplied from the second power source 105 via the second matcher 107 to be transmitted to the FS electrode 103, while inhibiting the transmission of the high frequency of the first frequency $f_1$ supplied from the first power source 104 via the coil 102 and the FS electrode 103. Thus, the high-frequency signal of the first frequency $f_1$ can be prevented from entering into the second matcher 107. Also, part of the high-frequency power of the first frequency $f_1$ is suppressed from flowing into the second matcher. In this case, the high-frequency power of the first frequency $f_1$ supplied by the first power source is not consumed by the second matcher, and is mostly consumed by the coil 102. Therefore, the high-frequency power of the first frequency $f_1$ supplied by the first power source can be accurately measured, and the state of the plasma in the chamber can be accurately evaluated.

In measuring the high-frequency power supplied by the first power source, by connecting a measuring instrument to the first power source, the change with time of the high-frequency power can be monitored.

The high pass filter 109 is connected between the first power source 104 and the first matcher 106. The high pass filter 109 allows the high frequency of the first frequency $f_1$ supplied from the first power source 104 via the first matcher 106 to be transmitted to the coil 102, while inhibiting the transmission of the high frequency of the second frequency $f_2$ supplied from the second power source 105 via the FS electrode 103 and the coil 102. Thus, the high-frequency signal of the second frequency $f_2$ can be prevented from entering into the first power source 104. Therefore, the magnitude of the high-frequency power supplied by the first power source can be accurately measured. Thus, the information on the plasma in the chamber can be acquired with high accuracy.

Figure 3:
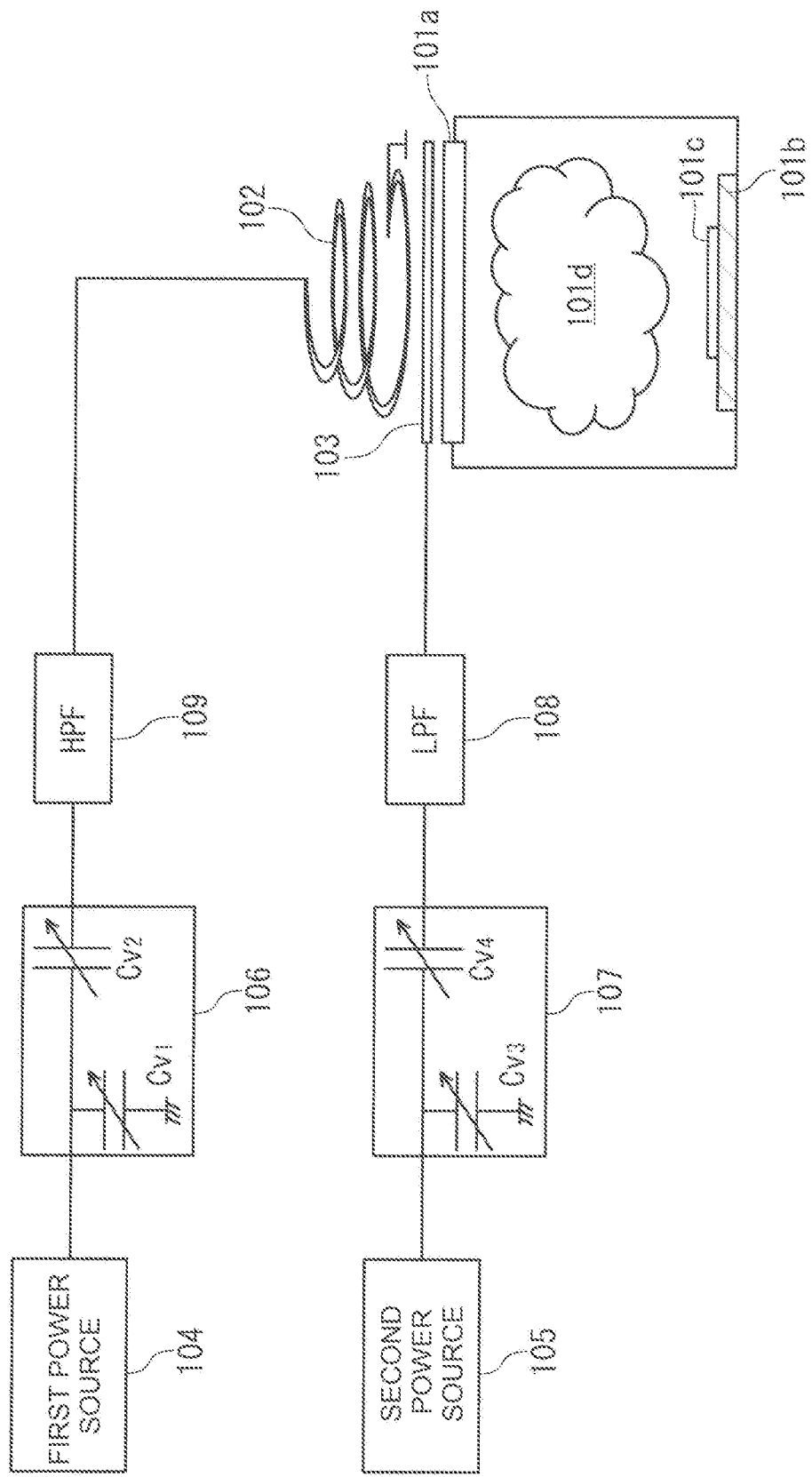
FIG. 3 is a block diagram schematically showing a configuration of a plasma processing apparatus according to another embodiment of the present invention.

The high pass filter 109 may be placed at any position between the first power source 104 and the coil 102. The high pass filter 109 may be connected, for example, between the first matcher 106 and the coil 102, as shown in FIG. 3. However, a higher voltage may be applied on the downstream side of the first matcher 106 (on the coil 102 side), as compared to on the upstream side of the first matcher 106 (on the first power source 104 side). Therefore, the high pass filter 109 is preferably connected between the first power source 104 and the first matcher 106. In this case, the filter circuit can be configured using an element with low breakdown voltage, and the size reduction of the high pass filter 109 can be easily achieved.

INDUSTRIAL APPLICABILITY

The plasma processing apparatus according to the present invention can be applied to a process where simple maintenance and high-density plasma generation is required, and is applicable to various plasma processing apparatuses including a dry etching apparatus and a plasma CVD apparatus.

REFERENCE NUMERALS

- 100: plasma processing apparatus
  - 101: chamber
  - 101a: dielectric window
  - 101b: stage
  - 101c: object to be processed
  - 101d: plasma
- 102: coil
- 103: FS electrode
- 104: first power source
- 105: second power source
- 106: first matcher
- 107: second matcher
- 108: low pass filter
- 109: high pass filter
- 110: housing container
- 111: gas supply port
- 112: exhaust port
- 113: lower electrode
- 114: variable capacitor
- 115: lower electrode high-frequency power source
- 116: dielectric member (dielectric window)
- 117: electrostatic chuck

What is claimed is:

1. A plasma processing apparatus, comprising:
   a chamber having a dielectric window;
   a coil placed outside the chamber so as to face the dielectric window;
   a Faraday shield electrode having a plate shape and placed on a side of the chamber of the coil;
   a first power source for supplying a high-frequency power of a first frequency to the coil;
   a second power source for supplying a high-frequency power of a second frequency to the Faraday shield electrode, the second frequency being different from the first frequency;
   a first matcher for matching a first impedance between the first power source and the coil;
   a second matcher for matching a second impedance between the second power source and the Faraday shield electrode; and
   a first frequency attenuation filter configured to allow transmission of the high-frequency power of the second frequency and inhibit transmission of the high-frequency power of the first frequency; and
   a second frequency attenuation filter configured to allow transmission of the high-frequency power of the first frequency and inhibit transmission of the high-frequency power of the second frequency, wherein
   the second matcher is connected to an output side of the second power source, and is connected to the Faraday shield electrode via the first frequency attenuation filter,
   the second frequency attenuation filter is connected to an output side of the first power source, and
   the first power source is connected to the coil via the first matcher placed on a coil side of the second frequency attenuation filter.

2. The plasma processing apparatus according to claim 1, wherein the first matcher is directly connected to the coil.

3. The plasma processing apparatus according to claim 1, wherein the first frequency attenuation filter is directly connected to the Faraday shield electrode.

4. The plasma processing apparatus according to claim 1, wherein the first frequency is higher than the second frequency, the first frequency attenuation filter being a low pass filter which attenuates components of input signals of frequencies higher than a cutoff frequency, the cutoff frequency being at between the first frequency and the second frequency.

5. The plasma processing apparatus according to claim 1, wherein the first frequency is lower than the second frequency, the first frequency attenuation filter being a high pass filter which attenuates components of input signals of frequencies lower than a cutoff frequency, the cutoff frequency being at between the first frequency and the second frequency.

6. The plasma processing apparatus according to claim 1, wherein space exists between the coil and the Faraday shield electrode.

7. A plasma processing apparatus, comprising:
   a chamber having a dielectric window;

a coil placed outside the chamber so as to face the dielectric window;
a Faraday shield electrode placed on a side of the chamber of the coil with space existing between the coil and the Faraday shield electrode;
a first power source for supplying a high-frequency power of a first frequency to the coil;
a second power source for supplying a high-frequency power of a second frequency to the Faraday shield electrode, the second frequency being different from the first frequency;
a first matcher for matching a first impedance between the first power source and the coil;
a second matcher for matching a first impedance between the second power source and the Faraday shield electrode; and
a first frequency attenuation filter configured to allow transmission of the high-frequency power of the second frequency and inhibit transmission of the high-frequency power of the first frequency; and
a second frequency attenuation filter configured to allow transmission of the high-frequency power of the first frequency and inhibit transmission of the high-frequency power of the second frequency, wherein
the first power source is connected to the coil via the second frequency attenuation filter so as to prevent the high-frequency power of the second frequency having entered the coil from the second power source via the space to enter into the first power source, and
the second power source is connected to the Faraday shield electrode via the first frequency attenuation filter so as to prevent the high-frequency power of the first frequency having entered the Faraday shield electrode from the first power source via the space to enter into the second power source.

8. The plasma processing apparatus according to claim 7, wherein the coil is formed of a conductor expanding spirally, and
the second frequency attenuation filter is connected to an output side of the first power source, and
the first power source is connected to the coil via the first matcher placed on a coil side of the second frequency attenuation filter.

9. The plasma processing apparatus according to claim 7, wherein the Faraday shield electrode has a plate shape, and
the second matcher is connected to an output side of the second power source and is connected to the Faraday shield electrode via the first frequency attenuation filter.

10. The plasma processing apparatus according to claim 7, wherein the first matcher is directly connected to the coil.

* * * * *